US012165882B2

(12) United States Patent
Akasu et al.

(10) Patent No.: US 12,165,882 B2
(45) Date of Patent: Dec. 10, 2024

(54) SEMICONDUCTOR DEVICE MANUFACTURING METHOD

(71) Applicant: Resonac Corporation, Tokyo (JP)

(72) Inventors: Yuta Akasu, Tokyo (JP); Emi Miyazawa, Tokyo (JP); Takashi Kawamori, Tokyo (JP); Shogo Sobue, Tokyo (JP); Yasuyuki Oyama, Tokyo (JP)

( * ) Notice: Subject to any disclaimer, the term of this patent is extended or adjusted under 35 U.S.C. 154(b) by 435 days.

(21) Appl. No.: 17/612,224

(22) PCT Filed: May 20, 2020

(86) PCT No.: PCT/JP2020/019963
 § 371 (c)(1),
 (2) Date: Nov. 18, 2021

(87) PCT Pub. No.: WO2020/235597
 PCT Pub. Date: Nov. 26, 2020

(65) Prior Publication Data
 US 2022/0319872 A1 Oct. 6, 2022

(30) Foreign Application Priority Data

May 22, 2019 (JP) ................. 2019-096008

(51) Int. Cl.
 *H01L 21/56* (2006.01)
 *H01L 21/02* (2006.01)
(52) U.S. Cl.
 CPC ...... *H01L 21/568* (2013.01); *H01L 21/02334* (2013.01); *H01L 21/02345* (2013.01)
(58) Field of Classification Search
 CPC ............ C09J 2203/326; C09J 2301/416; C09J 2301/502; C09J 5/00; C09J 7/35;
 (Continued)

(56) References Cited

U.S. PATENT DOCUMENTS

2001/0038269 A1* 11/2001 Grossman ............ G01N 17/004
 315/219
2003/0168004 A1* 9/2003 Nakata .............. H01L 21/02274
 118/50.1
 (Continued)

FOREIGN PATENT DOCUMENTS

CN       105103267     11/2015
JP       2012-126803    7/2012
 (Continued)

OTHER PUBLICATIONS

International Search Report dated Jul. 28, 2020 for PCT/JP2020/019963.
 (Continued)

*Primary Examiner* — Galina G Yushina
(74) *Attorney, Agent, or Firm* — SOEI PATENT & LAW FIRM

(57) ABSTRACT

A method of producing a semiconductor device including: providing a temporary fixing laminate having a supporting substrate; machining a semiconductor member that is temporarily fixed to the supporting substrate; and separating the semiconductor member from the supporting substrate by irradiating the temporary fixing laminate with light from a side of a rear surface of the supporting substrate. A plurality of the irradiation target regions set at the rear surface are sequentially irradiated with light, and each of the irradiation target regions includes a part of the rear surface. The irradiation target regions adjacent to each other partially overlap with each other as viewed from a direction perpendicular to the rear surface, and a region in which the plurality of the irradiation target regions are combined includes the entire rear surface.

4 Claims, 9 Drawing Sheets

(58) Field of Classification Search
CPC ............... H01L 2224/96; H01L 21/568; H01L 21/02334; H01L 21/02345; H01L 21/561; H01L 21/6835; H01L 21/78; H01L 2221/68327; H01L 2221/68354; H01L 2221/68381; H01L 2221/68368; H01L 2221/68318
See application file for complete search history.

(56) References Cited

U.S. PATENT DOCUMENTS

| | | | | |
|---|---|---|---|---|
| 2003/0194506 | A1* | 10/2003 | Drzal | B05D 3/064 |
| | | | | 427/553 |
| 2005/0059263 | A1* | 3/2005 | Nakazawa | H01L 21/268 |
| | | | | 438/784 |
| 2011/0132549 | A1* | 6/2011 | Sercel | B23K 26/40 |
| | | | | 156/753 |
| 2011/0281383 | A1* | 11/2011 | Chung | H01L 33/005 |
| | | | | 438/33 |
| 2012/0052632 | A1 | 3/2012 | Sato et al. | |
| 2012/0077313 | A1 | 3/2012 | Homma et al. | |
| 2013/0087959 | A1* | 4/2013 | Tran | H01L 21/68757 |
| | | | | 156/60 |
| 2014/0231012 | A1* | 8/2014 | Hinode | C09K 13/04 |
| | | | | 156/345.23 |
| 2016/0064265 | A1* | 3/2016 | Nakamura | H01L 21/76898 |
| | | | | 156/247 |
| 2016/0163579 | A1 | 6/2016 | Nakamura et al. | |
| 2017/0103945 | A1 | 4/2017 | Kobayashi et al. | |
| 2019/0348573 | A1* | 11/2019 | Raymond | H01L 25/0753 |

FOREIGN PATENT DOCUMENTS

| | | |
|---|---|---|
| JP | 2013-033814 | 2/2013 |
| JP | 2013-534721 | 9/2013 |
| JP | 2016-048729 | 4/2016 |
| JP | 2016-138182 | 8/2016 |
| KR | 10-2012-0097394 | 9/2012 |
| KR | 10-2013-0036317 | 4/2013 |
| WO | 2011/159456 | 12/2011 |

OTHER PUBLICATIONS

International Preliminary Report on Patentability with Written Opinion dated Dec. 2, 2021 for PCT/JP2020/019963.

Extended Search Report in corresponding European Application No. 20810743.3, dated Jun. 23, 2022.

* cited by examiner (b)

(c)

(a)

(b)

(a)

(b)

(a)

(b)

hν

(c)

(b)

SEMICONDUCTOR DEVICE MANUFACTURING METHOD

CROSS-REFERENCE TO RELATED APPLICATIONS

This application is a 35 U.S.C. § 371 national phase application of PCT/JP2020/019963, filed on May 20, 2020, which claims priority to Japanese Patent Application No. 2019-096008, filed on May 22, 2019.

TECHNICAL FIELD

The present invention relates to a semiconductor device manufacturing method.

BACKGROUND ART

In the field of semiconductor devices, in recent years, a technique relating to a package called system in package (SIP), in which a plurality of semiconductor elements are laminated, has been remarkably growing. Since a large number of semiconductor elements are laminated in a SIP type package, it is necessary to reduce the thickness of the semiconductor elements. Therefore, after incorporating the integrated circuit into the semiconductor member (for example, the semiconductor wafer), machining, such as thinning processing of grinding the rear surface of the semiconductor member and singulation processing of dicing the semiconductor wafer, may be performed. The machining of the semiconductor members is typically performed in a state where the semiconductor members are temporarily fixed to the supporting substrate by the temporary fixing material layer (refer to, for example, Patent Literatures 1 to 3). Patent Literatures 2 and 3 disclose a method of separating a semiconductor member by irradiating a temporary fixing material layer with laser light (coherent light).

CITATION LIST

Patent Literature

Patent Literature 1: Japanese Unexamined Patent Publication No. 2012-126803
Patent Literature 2: Japanese Unexamined Patent Publication No. 2016-138182
Patent Literature 3: Japanese Unexamined Patent Publication No. 2013-033814

SUMMARY OF INVENTION

Technical Problem

According to an aspect of the present invention, regarding a method of producing a semiconductor device which includes a step of machining a semiconductor member temporarily fixed to a supporting substrate, there is provided a method of easily separating the machined semiconductor member from the supporting substrate.

Solution to Problem

According to an aspect of the present invention, there is provided a method of producing a semiconductor device, comprising in the following order: a step of providing a temporary fixing laminate comprising a supporting substrate and a temporary fixing material layer, the supporting substrate having a supporting surface and a rear surface opposite to the supporting surface, the temporary fixing material layer being provided on the supporting surface and comprising a curable resin layer comprising at least one outermost surface of the temporary fixing material layer; temporarily fixing a semiconductor member to the supporting substrate with the temporary fixing material layer interposed therebetween; machining the semiconductor member temporarily fixed to the supporting substrate; and separating the semiconductor member from the supporting substrate by irradiating the temporary fixing laminate with light from a side of the rear surface, in which a part or an entirety of the temporary fixing material layer is a light absorption layer that generates heat by absorbing the light, a plurality of irradiation target regions are sequentially irradiated with the light, and each of the irradiation target regions includes a part of the rear surface, and the irradiation target regions adjacent to each other partially overlap with each other as viewed from a direction perpendicular to the rear surface, and a region in which the plurality of irradiation target regions are combined includes the entire rear surface.

Advantageous Effects of Invention

According to an aspect of the present invention, regarding a method of manufacturing a semiconductor device which includes a step of machining a semiconductor member temporarily fixed to a supporting substrate, there is provided a method of easily separating the machined semiconductor member from the supporting substrate through simple processing.

DESCRIPTION OF EMBODIMENTS

Some embodiments of the present invention will be hereinafter described in detail. However, the present invention is not limited to the following embodiments.

The size of the components in each drawing referred to the present specification is conceptual, and the relative size relationships between the components are not limited to those shown in each drawing. Duplicate explanations may not be repeated.

Numerical values and their ranges in the present specification also do not limit the scope of the present invention. The numerical range indicated by using "to" in the present specification indicates a range including numerical values before and after "to" as the minimum value and the maximum value, respectively. In the numerical range described in stages in the present specification, the upper limit value or the lower limit value described in one numerical range may be replaced with the upper limit value or the lower limit value of another numerical range described in stages. In the numerical range described in the present specification, the upper limit value or the lower limit value of the numerical range may be replaced with the value shown in examples.

In the present specification, (meth)acrylic acid means acrylic acid or methacrylic acid corresponding thereto. Likewise, other similar expressions such as (meth)acrylate and (meth)acryloyl group are used.

Figure 1:
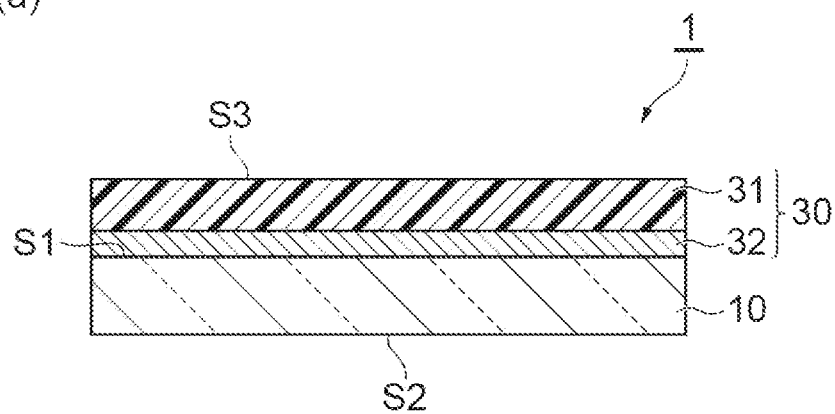
FIGS. 1(a), 1(b), and 1(c) are schematic views showing an embodiment of a method of producing a semiconductor device.
Figure 1:
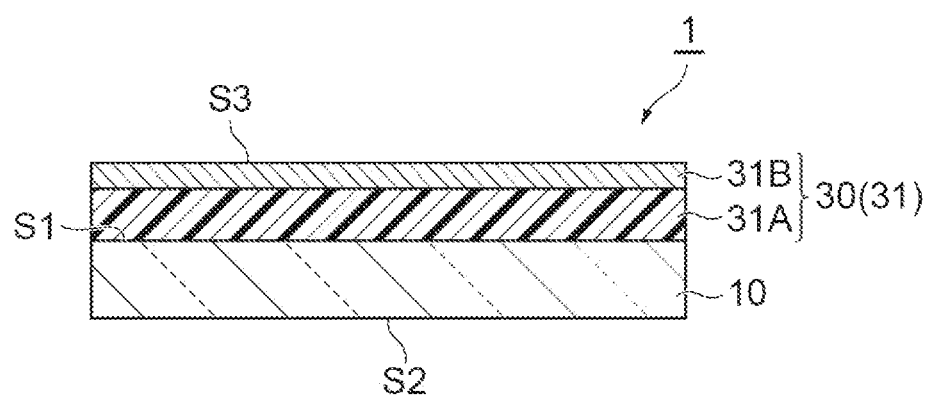
Figure 1:
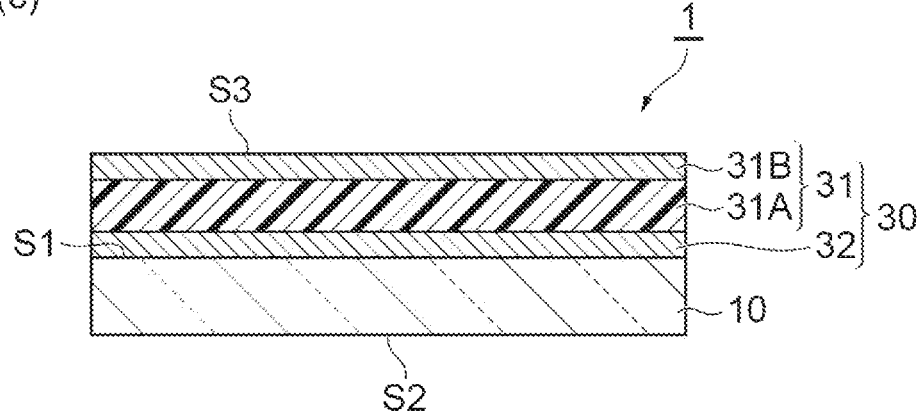

In order to produce a semiconductor device, a temporary fixing laminate for temporarily fixing the semiconductor member to a supporting substrate while the semiconductor member is machined, is prepared. FIG. 1 is a cross-sectional view showing some embodiments of the temporary fixing laminate. The temporary fixing laminate 1 shown in FIG. 1 has a supporting substrate 10 having a principal surface as a supporting surface S1 and a rear surface S2 on the rear side of the supporting surface, and a temporary fixing material layer 30 provided on the supporting surface S1 of the supporting substrate 10. The temporary fixing material layer 30 has a curable resin layer 31. The curable resin layer 31 includes the outermost surface S3 on a side of the temporary fixing material layer 30 opposite to the supporting substrate 10. In addition, the temporary fixing material layer 30 has a light absorption layer 32 provided as a layer different from the curable resin layer 31, or a light absorption layer 31B provided as a part of the curable resin layer 31. The light absorption layers 32 and 31B are layers that generate heat by absorbing light.

The temporary fixing material layer 30 of the temporary fixing laminate 1 shown in FIG. 1(a) has a curable resin layer 31 including the outermost surface S3 on the opposite side of the supporting substrate 10, and a light absorption layer 32 provided as a layer different from the curable resin layer 31. In other words, the light absorption layer 32 and the curable resin layer 31 are laminated in this order on the supporting surface S1 which is one principal surface of the supporting substrate 10.

The temporary fixing material layer 30 of the temporary fixing laminate 1 shown in FIG. 1(b) is formed of a curable resin layer 31 including a light absorption layer 31B as a part thereof. The curable resin layer 31 described herein has a light absorption layer 31B including the outermost surface S3 and a curable resin layer 31A that generates substantially no heat provided on the supporting substrate 10 side of the light absorption layer 31B.

In the case of the temporary fixing material layer 30 of the temporary fixing laminate 1 shown in FIG. 1(c), in addition to the same light absorption layer 31B as in FIG. 1(b), the light absorption layer 32 may be further provided as a layer different from the curable resin layer 31. Instead of the light absorption layer 32 provided as a layer different from the curable resin layer 31, a light absorption layer forming a part of the curable resin layer 31 may be further provided between the curable resin layer 31A and the supporting substrate 10.

The temporary fixing laminate 1 can be obtained, for example, by sequentially forming each layer on the supporting substrate 10. A laminated film having a curable resin layer and a light absorption layer may be prepared and laminated on the supporting substrate 10.

Figure 2:
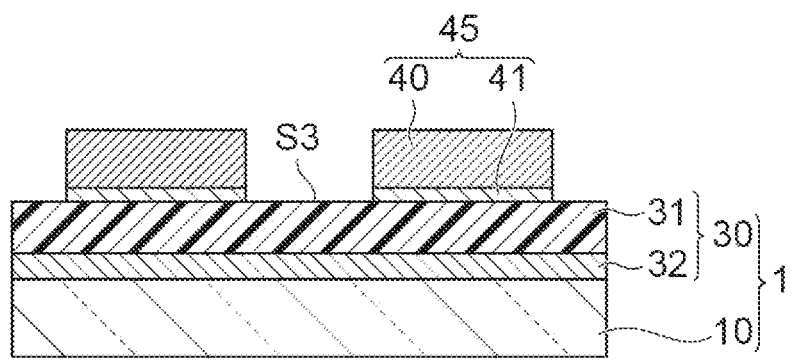
FIGS. 2(a) and 2(b) are schematic views showing an embodiment of a method of producing a semiconductor device.
Figure 2:
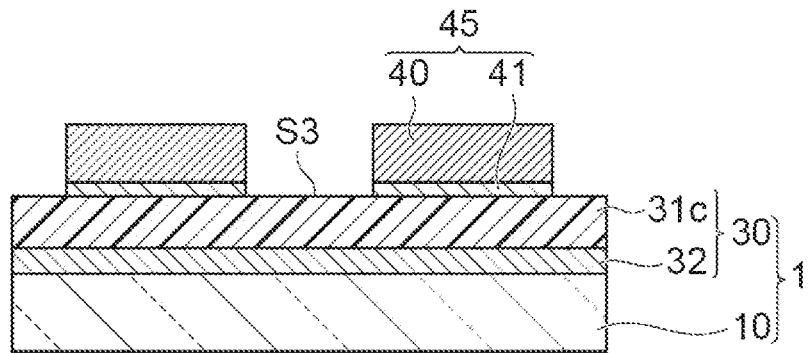
Figure 3:
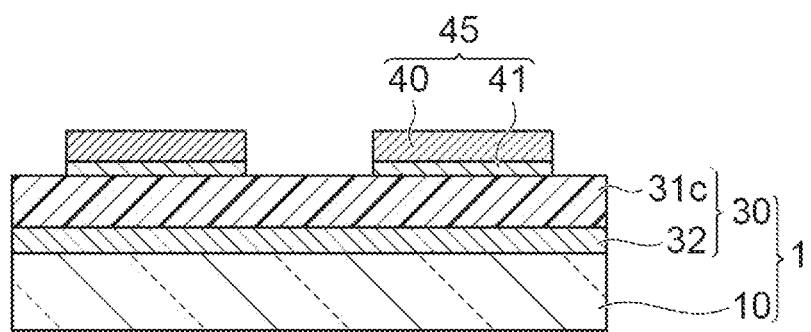
FIGS. 3(a) and 3(b) are schematic views showing an embodiment of a method of producing a semiconductor device.
Figure 3:
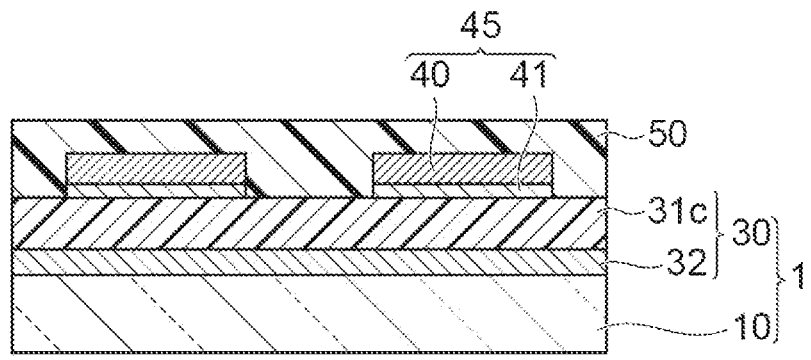
Figure 4:
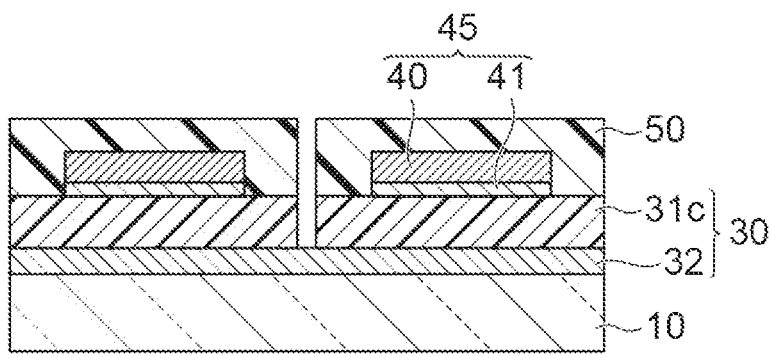
FIGS. 4(a), 4(b), and 4(c) are schematic views showing an embodiment of a method of producing a semiconductor device.
Figure 4:
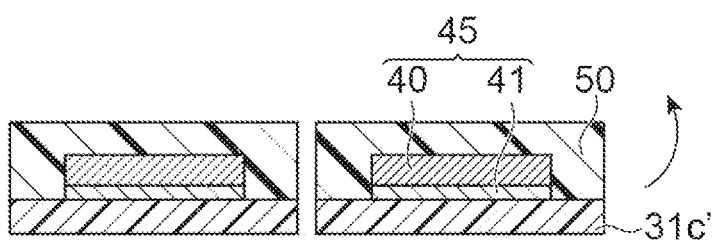
Figure 4:
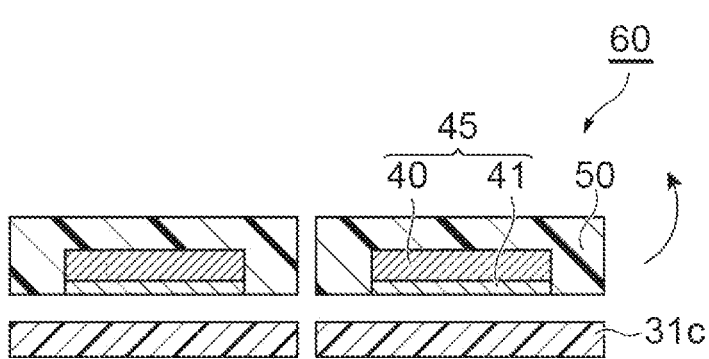

FIGS. 2, 3, and 4 are process diagrams showing an embodiment of a method of producing a semiconductor device using a temporary fixing laminate. Here, the method using the temporary fixing laminate 1 of FIG. 1(a) is exemplified, but a semiconductor device can be similarly produced by using the temporary fixing laminate having another configuration. The methods shown in FIGS. 2 to 4 include, in the following order, temporarily fixing the semiconductor member 45 to the supporting substrate 10 with the temporary fixing material layer 30 interposed therebetween (FIG. 2), machining the semiconductor member 45 temporarily fixed to the supporting substrate 10 (FIG. 3(a)), forming a sealing layer 50 for sealing the machined semiconductor member 45 (FIG. 3(b)), and separating the semiconductor member 45 from the supporting substrate 10 by irradiating the temporary fixing laminate 1 with light hv from the supporting substrate 10 side (FIG. 4(b)). The semiconductor member 45 has a semiconductor substrate 40 and a rewiring layer 41 provided on one surface side of the semiconductor substrate 40. The semiconductor member 45 may be disposed on the curable resin layer 31 so that the rewiring layer 41 is located on the curable resin layer 31 side.

The supporting substrate 10 is a plate-shaped body having a high transmittance and capable of withstanding a load received during machining of the semiconductor member 45. Examples of the supporting substrate 10 include an inorganic glass substrate and a transparent resin substrate.

The thickness of the supporting substrate 10 may be, for example, 0.1 to 2.0 mm. In a case where the thickness of the supporting substrate 10 is 0.1 mm or more, handling tends to be easy. In a case where the thickness of the supporting substrate 10 is 2.0 mm or less, the material cost tends to be suppressed.

The outermost surface S3 on the side where the semiconductor member 45 of the temporary fixing material layer 30 is temporarily fixed is the surface of the curable resin layer 31. For example, the semiconductor member 45 can be temporarily fixed to the supporting substrate 10 by curing the curable resin layer 31 with the semiconductor member 45 mounted on the curable resin layer 31. In other words, the semiconductor member 45 can be temporarily adhered to the supporting substrate 10 with the temporary fixing material layer 30, which has a cured curable resin layer 31c, interposed therebetween.

The curable resin layer 31 is a layer containing a curing resin composition that is cured by heat or light. The curable resin layer 31 before curing has an adhesiveness (or adherence property) to such an extent that the semiconductor member 45 can be attached by compression bonding or the like. The cured curable resin layer 31c holds the semiconductor member 45 to be machined. In the present specification, all the components other than the conductive particles constituting the curable resin layer 31 are regarded as components of the curing resin composition.

From the viewpoint of stress relaxation, the thickness of the curable resin layer 31 may be, for example, 2000 μm or less, 500 μm or less, or 200 μm or less, and may be 0.1 μm or more, or 1 μm or more.

The storage elastic modulus of the cured curable resin layer 31c at 25° C. may be 5 to 100 MPa. In a case where the storage elastic modulus of the cured curable resin layer 31c at 25° C. is 5 MPa or more, the semiconductor member 45 can be easily held without bending of the supporting substrate 10. Further, when the semiconductor member 45 is separated from the supporting substrate, the curable resin layer 31c tends not to leave a residue on the semiconductor member 45. In a case where the storage elastic modulus of the cured curable resin layer 31c at 25° C. is 100 MPa or less, the displacement of the semiconductor member 45 tends to be small. From the same viewpoint, the storage elastic modulus of the cured curable resin layer 31c at 25° C. may be 5.5 MPa or more, 6.0 MPa or more, or 6.3 MPa or more, and may be 90 MPa or less, 80 MPa or less, 70 MPa or less, or 65 MPa or less. In the present specification, the storage elastic modulus of the cured curable resin layer 31c means a value which is obtained by a viscoelasticity measurement measured under the conditions of a temperature rise rate of 5° C./min, a frequency of 1 Hz, and a tensile mode.

The storage elastic modulus of the cured curable resin layer 31c at 25° C. can be increased by, for example, a method of increasing the content of the hydrocarbon resin described later, applying a hydrocarbon resin having a high Tg, and adding an insulating filler to the curing resin composition.

The storage elastic modulus of the cured curable resin layer 31c at 250° C. may be 0.70 MPa or more, 0.80 MPa or more, 0.85 MPa or more, or 0.90 MPa or more, and may be 2.00 MPa or less, 1.90 MPa or less, 1.80 MPa or less, or 1.75 MPa or less.

The curing resin composition constituting the curable resin layer 31 may contain a thermosetting resin and a hydrocarbon resin. The hydrocarbon resin is a resin of which the main framework is composed of hydrocarbons. In a case where the curing resin composition contains a hydrocarbon resin, the semiconductor member 45 can be easily attached to the curable resin layer 31 at a low temperature.

From the viewpoint of the adherence property of the curable resin layer 31 at a low temperature, the glass transition temperature (Tg) of the hydrocarbon resin may be 50° C. or lower. From the viewpoint of favorable peelability of the curable resin layer 31, the Tg of the hydrocarbon resin may be −100° C. or higher, or −50° C. or higher.

The Tg of the hydrocarbon resin is an intermediate point glass transition temperature value obtained by a differential scanning calorimetry (DSC). Specifically, the Tg of the hydrocarbon resin is an intermediate point glass transition temperature value calculated by a method based on JIS K7121 by measuring the change in calorific value under the conditions of a temperature rise rate of 10° C./min and a measurement temperature of −80 to 80° C.

Examples of the hydrocarbon resin includes, at least one selected from ethylene/propylene copolymers, ethylene/1-butene copolymers, ethylene/propylene/1-butene copolymer elastomers, ethylene/1-hexene copolymers, ethylene/1-octene copolymers, ethylene/styrene copolymers, ethylene/norbornene copolymers, propylene/1-butene copolymers, ethylene/propylene/unconjugated diene copolymers, ethylene/1-butene/unconjugated diene copolymers, ethylene/propylene/1-butene/unconjugated diene copolymers, polyisoprene, polybutadiene, styrene/butadiene/styrene block copolymers (SBS), styrene/isoprene/styrene block copolymers (SIS), styrene/ethylene/butylene/styrene block copolymers (SEBS), styrene/ethylene/propylene/styrene block copolymers (SEPS), and a group consisting of hydrogen additives thereof. The hydrocarbon resins may have a carboxyl group. The carboxyl group is introduced by, for example, modification using maleic anhydride or the like. The hydrocarbon resin may include a styrene-based resin including a monomer unit derived from styrene. The styrene-based resin may be a styrene/ethylene/butylene/styrene block copolymers (SEBS).

The weight-average molecular weight (Mw) of the hydrocarbon resin may be 10,000 to 5 million or 100,000 to 2 million. In a case where the weight-average molecular weight is 10,000 or more, the heat resistance of the temporary fixing material layer 30 tends to be easily secured. In a case where the weight-average molecular weight is 5 million or less, it tends to be easy to suppress a decrease in the flow and a decrease in the adherence property of the temporary fixing material layer 30. The weight-average molecular weight described herein is a polystyrene equivalent value using a calibration curve using standard polystyrene by gel permeation chromatography (GPC).

The content of the hydrocarbon resin may be 40 parts by mass or more, 50 parts by mass or more, or 60 parts by mass or more, and may be 90 parts by mass or less, 85 parts by mass or less, or 80 parts by mass or less, with respect to 100 parts by mass as the total mass of the curing resin composition constituting the curable resin layer 31. In a case where the content of the hydrocarbon resin is within the numerical range, the thin and flat curable resin layer 31 tends to be easily formed. Further, the curable resin layer 31 tends to have favorable pressure-sensitive adhesiveness at low temperature and an appropriate storage elastic modulus after curing.

The thermosetting resin is a component that cures the curing resin composition through thermosetting reaction. The thermosetting reaction may be a reaction between a thermosetting resin and a curing agent, self-polymerization of a thermosetting resin, or a combination thereof. Examples of the thermosetting resin may include an epoxy resin, acrylic resin, silicone resin, phenol resin, thermosetting polyimide resin, polyurethane resin, melamine resin, and urea resin. Only one type thereof or a combination of two or more types thereof may be used. The thermosetting resin may include an epoxy resin because the resin is excellent in heat resistance, workability, and reliability.

The epoxy resin is a compound having one or more epoxy groups. The epoxy resin may have two or more epoxy groups. Examples of the epoxy resin having two or more epoxy groups include a bisphenol A type epoxy resin, novolac type epoxy resin (phenol novolac type epoxy resin, and the like), glycidylamine type epoxy resin, heterocycle-containing epoxy resin, and alicyclic epoxy resin.

The curing resin composition may contain a thermosetting resin and a curing agent thereof. The total content of the thermosetting resin and the curing agent thereof may be 10 parts by mass or more, 15 parts by mass or more, or 20 parts by mass or more, and may be 60 parts by mass or less, 50 parts by mass or less, or 40 parts by mass or less, with respect to 100 parts by mass as the total mass of the curing resin composition. In a case where the total content of the thermosetting resin and its curing agent is within the ranges, the thin and flat curable resin layer tends to be easily formed, and the heat resistance of the cured curable resin layer 31c tends to be more excellent.

In a case where an epoxy resin is used as the thermosetting resin, the curing resin composition may contain a curing agent for the epoxy resin. The curing agent for the epoxy resin is not particularly limited. Examples thereof include amine, polyamide, acid anhydride, polysulfide, boron trifluoride, bisphenol (bisphenol A, bisphenol F, bisphenol S, and the like), and phenol resin (phenol novolac resin, bisphenol A novolac resin, cresol novolac resin, phenol aralkyl resin, and the like).

The thermosetting resin composition may further contain a curing accelerator that accelerates the curing reaction of the thermosetting resin such as an epoxy resin. Examples of the curing accelerator include imidazole compounds, dicyandiamide, dicarboxylic acid dihydrazide, triphenylphosphine, tetraphenylphosphonium tetraphenylborate, 2-ethyl-4-methylimidazole-tetraphenylborate, and 1,8-diazabicyclo [5, 4, 0] undecene-7-tetraphenylborate. Only one type thereof or a combination of two or more types thereof may be used.

The content of the curing accelerator may be 0.01 to 5 parts by mass with respect to 100 parts by mass as the total mass of the thermosetting resin and the curing agent. In a case where the content of the curing accelerator is within this range, the curability of the curable resin layer and the heat resistance after curing tend to be more excellent.

The curing resin composition constituting the curable resin layer 31 may contain a polymerizable monomer having a polymerizable unsaturated group and a polymerization initiator. In this case as well, the curing resin composition may further contain the above-mentioned hydrocarbon resin.

The polymerizable monomer is a compound that has a polymerizable unsaturated group such as an ethylenically unsaturated group. The polymerizable monomer may be monofunctional, bifunctional, or trifunctional or higher. However, a bifunctional or higher polymerizable monomer may be used from the viewpoint of obtaining sufficient curability. Examples of the polymerizable monomer include (meth)acrylate, vinylidene halide, vinyl ether, vinyl ester, vinylpyridine, vinylamide, and vinyl arylated. The polymerizable monomer may be (meth)acrylate or (meth)acrylic acid. The (meth)acrylate may be monofunctional (meth)acrylate, bifunctional (meth)acrylate, trifunctional or higher polyfunctional (meth)acrylate, or a combination thereof.

Examples of the monofunctional (meth)acrylate include: aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth)acrylate, nonyl (meth)acrylate, decyl (meth)acrylate, 2-hydroxyethyl (meth)acrylate, 2-hydroxypropyl (meth)acrylate, 3-chloro-2-hydroxypropyl (meth)acrylate, 2-hydroxybutyl (meth)acrylate, methoxypolyethylene glycol (meth)acrylate, ethoxypolyethylene glycol (meth)acrylate, methoxypolypropylene glycol (meth)acrylate, ethoxypolypropylene glycol (meth)acrylate, and mono (2-(meth)acryloyloxyethyl) succinate; and aromatic (meth)acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxypolyethylene glycol (meth)acrylate, nonylphenoxypolyethylene glycol (meth)acrylate, phenoxypolypropylene glycol (meth)acrylate, 2-hydroxy-3-phenoxypropyl (meth)acrylate, 2-hydroxy-3-(o-phenylphenoxy) propyl (meth)acrylate, 2-hydroxy-3-(1-naphthoxy) propyl (meth)acrylate, and 2-hydroxy-3-(2-naphthoxy) propyl (meth)acrylate.

Examples of the bifunctional (meth)acrylate include: aliphatic (meth)acrylates such as ethylene glycol di(meth)acrylate, diethylene glycol di(meth)acrylate, triethylene glycol di(meth)acrylate, tetraethylene glycol di(meth)acrylate, and polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecanedimethanol (meth)acrylate, and ethoxylated 2-methyl-1,3-propanediol di(meth)acrylate; and aromatic (meth)acrylates such as ethoxylated bisphenol A di(meth)acrylate, propoxylated bisphenol A di(meth)acrylate, ethoxylated propoxylated bisphenol A di(meth)acrylate, ethoxylated bisphenol F di(meth)acrylate, propoxylated bisphenol F di(meth)acrylate, ethoxylated propoxylated bisphenol F di(meth)acrylate, ethoxylated fluorene di(meth)acrylate, propoxylated fluorene di(meth)acrylate, and ethoxylated propoxylated fluorene di(meth)acrylate.

Examples of the trifunctional or higher functional polyfunctional (meth)acrylate include aliphatic (meth)acrylates such as trimethylpropane tri(meth)acrylates, ethoxylated trimethylol propane tri(meth)acrylates, propoxylated trimethylol propane tri(meth)acrylates, and ethoxylated propoxylated trimethylol propanthol tri(meth)acrylate, pentaerythritol tri(meth)acrylate, ethoxylated pentaerythritol tri (meth)acrylate, propoxylated pentaerythritol tri(meth)acrylate, ethoxylated propoxylated pentaerythritol tri(meth) acrylate, penta elythritol tetra (meth)acrylate, ethoxylated pentaerythritol tetra (meth)acrylate, propoxylated pentaerythritol tetra (meth)acrylate, ethoxylated propoxylated pentaerythritol tetra (meth)acrylate, ditrimethylolpropane tetraacrylate, and dipentaerythritol hexa (meth)acrylate; and aromatic epoxy (meth)acrylates such as phenol novolac type epoxy (meth)acrylate and cresol novolac type epoxy (meth) acrylate.

The (meth)acrylates may be used alone or in combination of two or more types. The (meth)acrylates may be combined with other polymerizable monomers.

The content of the polymerizable monomer may be 10 to 60 parts by mass with respect to 100 parts by mass as the total mass of the curing resin composition constituting the curable resin layer 31.

The polymerization initiator is a compound that initiates polymerization reaction of the polymerizable monomer by heating or irradiation with ultraviolet light or the like. For example, in a case where the polymerizable monomer is a compound having an ethylenically unsaturated group, the polymerization initiator may be a thermal radical polymerization initiator, a photoradical polymerization initiator, or a combination thereof.

Examples of the thermal radical polymerization initiator include: diacyl peroxides such as octanoyl peroxide, lauroyl peroxide, stearyl peroxide, and benzoyl peroxide; peroxyesters such as t-butylperoxypivalate, t-hexylperoxypivalate, 1,1,3,3-tetramethylbutylperoxy-2-ethyl hexanoate, 2,5-dimethyl-2,5-bis (2-ethylhexanoylperoxy)hexane, t-hexylperoxy-2-ethyl hexanoate, t-butylperoxy-2-ethyl hexanoate, t-butylperoxyisobutyrate, t-hexylperoxy isopropylmonocarbonate, t-butylperoxy-3,5,5-trimethyl hexanoate, t-butylperoxylaurilate, t-butylperoxy isopropyl monocarbonate, t-butylperoxy-2-ethylhexyl monocarbonate, t-butylperoxy benzoate, t-hexylperoxy benzoate, 2,5-dimethyl-2,5-bis (benzoylperoxy)hexane, t-butylperoxy acetate; and azo compounds such as 2,2'-azobisisobutyronitrile, 2,2'-azobis (2,4-dimethylvaleronitrile), and 2,2'-azobis (4-methoxy-2'-dimethylvaleronitrile).

Examples of the photoradical polymerization initiator include: benzoyl ketals such as 2,2-dimethoxy-1,2-diphenylethane-1-one; α-hydroxyketones such as 1-hydroxycyclohexylphenylketone, 2-hydroxy-2-methyl-1-phenylpropane-1-one, 1-[4-(2-hydroxyethoxy)phenyl]-2-hydroxy-2-methyl-1-propane-1-one; and phosphine oxides such as bis (2,4,6-trimethylbenzoyl)phenylphosphine oxide, bis (2,6-dimethoxybenzoyl)-2,4,4-trimethylpentylphosphine oxide, and 2,4,6-trimethylbenzoyldiphenylphosphine oxide.

The thermal and photoradical polymerization initiators may be used alone or in combination of two or more types.

The content of the polymerization initiator may be 0.01 to 5 parts by mass with respect to 100 parts by mass as the total mass of the polymerizable monomer.

The curing resin composition constituting the curable resin layer 31 may further contain an insulating filler, a sensitizer, an antioxidant, and the like as other components.

The insulating filler is added in order to impart low thermal expansion and low hygroscopicity to the curing resin composition. Examples of the insulating filler include non-metallic inorganic fillers such as silica, alumina, boron nitride, titania, glass, and ceramics. The insulating fillers may be used alone or in combination of two or more types.

The content of the insulating filler may be 5 to 20 parts by mass with respect to 100 parts by mass as the total mass of the curing resin composition constituting the curable resin layer 31. In a case where the content of the insulating filler is within the numerical range, the cured curable resin layer 31c tends to have excellent heat resistance and favorable peelability.

Examples of the sensitizer include anthracene, phenanthrene, chrysene, benzopyrene, fluoranthene, rubrene, pyrene, xanthene, indanslen, thioxanthene-9-one, 2-isopropyl-9H-thioxanthene-9-one, 4-isopropyl-9H-thioxanthene-9-one, and 1-chloro-4-propoxythioxanthone. The content of the sensitizer may be 0.01 to 10 parts by mass with respect to 100 parts by mass as the total mass of the curing resin composition constituting the curable resin layer 31.

Examples of the antioxidant include quinone derivatives such as benzoquinone and hydroquinone, phenol derivatives such as 4-methoxyphenol and 4-t-butylcatechol, aminoxyl derivatives such as 2,2,6,6-tetramethylpiperidin-1-oxyl, 4-hydroxy-2,2,6,6-tetramethylpiperidin-1-oxyl, and hindered amine derivatives such as tetramethylpiperidylmethacrylate. The content of the antioxidant may be 0.1 to 10 parts by mass with respect to 100 parts by mass as the total mass of the curing resin composition constituting the curable resin layer 31.

The curable resin layer 31 is formed on the light absorption layer 32 by, for example, providing a supporting film and a laminated film having a curable resin layer formed on the supporting film in advance and attaching the laminated film to the light absorption layer 32. The laminated film can be attached to the light absorption layer 32 at the room temperature (20° C.) or while heating with a roll laminator, a vacuum laminator, or the like. The supporting film and the laminated film having a curable resin layer can be obtained by, for example, a method including: coating a resin varnish including a thermosetting resin or a polymerizable monomer, an organic solvent, and if necessary, other components to the supporting film; and removing the organic solvent from the coated film. Alternatively, the curable resin layer 31 may be formed on the light absorption layer 32 by a method in which the same resin varnish is directly coated on the light absorption layer 32 and the organic solvent is removed from the coated film.

The light absorption layer 32 is a layer that generates heat by absorbing light. An example of the light absorption layer 32 is a conductor layer including a conductor that absorbing light to generate heat. Examples of a conductor constituting the conductor layer as the light absorption layer 32 include metals, metal oxides, and conductive carbon materials. The metal may be an elemental metal such as chromium, copper, titanium, silver, platinum, or gold, or may be an alloy such as nickel-chromium, stainless steel, or copper-zinc. Examples of the metal oxide include indium tin oxide (ITO), zinc oxide, and niobium oxide. Only one type thereof or a combination of two or more types thereof may be used. The conductor may be chromium, titanium, or a conductive carbon material.

The light absorption layer 32 may be a single layer or a metal layer formed of a plurality of layers. For example, the light absorption layer 32 may be a metal layer formed of a copper layer and a titanium layer. The metal layer as the light absorption layer 32 may be a layer formed by physical vapor deposition (PVD) such as vacuum vapor deposition and sputtering, or chemical vapor deposition (CVD) such as plasma chemical vapor deposition. Alternatively, the metal layer may be a plating layer formed by electrolytic plating or electroless plating. According to physical vapor deposition, even in a case where the supporting substrate 10 has a large area, a metal layer as a light absorption layer 32 that covers the surface of the supporting substrate 10 can be efficiently formed.

Another example of the light absorption layer is a layer containing conductive particles that absorb light to generate heat and a binder resin in which the conductive particles are dispersed. The conductive particles may be particles including the above-mentioned conductor. The binder resin may be a curing resin composition. In such a case, the light absorption layer constitutes a part of the curable resin layer 31. For example, the light absorption layer 31B in the temporary fixing laminate 1 of FIG. 1(b) can be a layer containing conductive particles and a curing resin composition. The curing resin composition constituting the light absorption layer may contain the same components as the curing resin composition constituting the curable resin layer in a part other than the light absorption layer. The curing resin composition constituting the light absorption layer may be the same as or different from the curing resin composition constituting the curable resin layer in a part other than the light absorption layer. The content of the conductive particles in the light absorption layer may be 10 to 90 parts by mass, with respect to the total amount of the components other than the conductive particles in the light absorption layer, that is, 100 parts by mass as the mass of the binder resin or the curing resin composition.

The light absorption layer containing the conductive particles and the binder resin can be formed by, for example, a method including: coating a varnish including the conductive particles, the binder resin, and the organic solvent onto the supporting substrate or the curable resin layer; and removing the organic solvent from the coated film. The light absorption layer 32 prepared in advance may be laminated on the supporting substrate 10 or the curable resin layer. A laminate formed of a light absorption layer and a curable resin layer may be laminated on a supporting substrate.

The thickness of the light absorption layer 32 may be 1 to 5000 nm or 100 to 3000 nm from the viewpoint of light peelability. In a case where the thickness of the light absorption layer 32 is 50 to 300 nm, the light absorption layer 32 tends to have a sufficiently low transmittance.

The thickness of the temporary fixing material layer 30 (in the case of FIG. 1(a), the total thickness of the light absorption layer 32 and the curable resin layer 31) may be 0.1 to 2000 µm or 10 to 500 µm from the viewpoint of stress relaxation.

After providing the temporary fixing laminate 1, the semiconductor member 45 before machining is placed on the curable resin layer 31 as shown in FIG. 2(a). The semiconductor member 45 has a semiconductor substrate 40 and a rewiring layer 41. The semiconductor member 45 may further have an external connection terminal. The semiconductor substrate 40 may be a semiconductor wafer or a semiconductor chip that is obtained by dividing a semiconductor wafer. In the example of FIG. 2(a), a plurality of semiconductor members 45 are mounted on the curable resin layer 31. However, the number of semiconductor members may be one. For example, a semiconductor member having one semiconductor wafer as a semiconductor substrate may be placed on a curable resin layer of one temporary fixing laminate.

The thickness of the semiconductor member 45 may be 1 to 1000 µm, 10 to 500 µm, or 20 to 200 µm from the viewpoint of suppressing cracks during transportation, machining, and the like, in addition to miniaturization and thinning of the semiconductor device.

The semiconductor member 45 mounted on the curable resin layer 31 is subjected to compression bonding onto the curable resin layer 31 by using, for example, a vacuum pressing machine or a vacuum laminator. In a case where a vacuum pressing machine is used, the compression bonding conditions may be an atmospheric pressure of 1 hPa or less, a compression bonding pressure of 1 MPa, a compression bonding temperature of 120 to 200° C., and a holding time of 100 to 300 seconds. In a case where a vacuum laminator is used, the compression bonding conditions may include, for example, an atmospheric pressure of 1 hPa or less, a compression bonding temperature of 60 to 180° C. or 80 to 150° C., a laminating pressure of 0.01 to 0.5 Mpa or 0.1 to 0.5 Mpa, and a holding time of 1 to 600 seconds or 30 to 300 seconds.

After the semiconductor member 45 is disposed on the curable resin layer 31, the curable resin layer 31 is thermally cured or photocured. Thereby, the semiconductor member 45 is temporarily fixed to the supporting substrate 10 with the temporary fixing material layer 30 having the cured curable resin layer 31c. The conditions for thermosetting may include, for example, 300° C. or lower or 100 to 200° C. for 1 to 180 minutes or 1 to 60 minutes.

Then, as shown in FIG. 3(a), a semiconductor member temporarily fixed to the supporting substrate 10 is machined. FIG. 3(a) shows an example of machining including thinning of the semiconductor substrate. The machining of semiconductor members is not limited to this, and may include, for example, thinning of semiconductor substrates, division (dicing) of semiconductor members, formation of through electrodes, etching processing, plating reflow processing, sputtering processing, or a combination thereof.

The thinning of the semiconductor substrate 40 is performed by grinding a surface of the semiconductor substrate 40 opposite to the rewiring layer 41 using a grinder or the like. The thickness of the thinned semiconductor substrate 40 may be, for example, 100 µm or less.

After machining the semiconductor member 45, as shown in FIG. 3(b), a sealing layer 50 that seals the machined semiconductor member 45 may be formed. The sealing layer 50 can be formed using a sealing material usually used for producing a semiconductor element. For example, the sealing layer 50 may be formed of a thermosetting resin composition. The thermosetting resin composition used for the sealing layer 50 includes, for example, epoxy resins such as cresol novolac epoxy resin, phenol novolac epoxy resin, biphenyl diepoxy resin, and naphthol novolac epoxy resin. The sealing layer 50 and the thermosetting resin composition for forming the sealing layer 50 may contain additives such as a filler and/or a flame retardant.

The sealing layer 50 is formed using, for example, a solid material, a liquid material, a fine-grained material, or a sealing film. In a case where the sealing film is used, a compression sealing molding machine, a vacuum laminating device, or the like is used. For example, using these devices, the semiconductor member 45 is coated with a sealing film formed by hot melting under the conditions of 40 to 180° C. (or 60 to 150° C.), 0.1 to 10 MPa (or 0.5 to 8 MPa), and 0.5 to 10 minutes. In such a manner, the sealing layer 50 can be formed. The thickness of the sealing film is adjusted so that the thickness of the sealing layer 50 is equal to or greater than a thickness of the machined semiconductor member 45. The thickness of the sealing film may be 50 to 2000 µm, 70 to 1500 µm, or 100 to 1000 µm.

After forming the sealing layer 50, as shown in FIG. 4(a), the sealing layer 50 and the curable resin layer 31c may be divided into a plurality of parts each including one semiconductor member 45.

As shown in FIG. 4(b), the temporary fixing laminate 1 is irradiated with light hv from the supporting substrate 10 side. Thereby, the semiconductor member 45 is separated from the supporting substrate 10. Through irradiation with light hv, the light absorption layer 32 absorbs the light and instantaneously generates heat. The generated heat may cause, for example, melting of the cured curable resin layer 31c, thermal stress generated between the supporting substrate 10 and the semiconductor member 45, and scattering of the light absorption layer 32. The semiconductor member 45 can be easily separated from the supporting substrate 10 mainly due to one or more of the phenomena. In a case where the curing resin composition constituting the curable resin layer 31 contain a hydrocarbon resin and the storage elastic modulus of the cured curable resin layer at 25° C. is 5 to 100 MPa, peeling at the interface between the light absorption layer 32 and the cured curable resin layer 31 tends to occur easily. This tendency is particularly remarkable in a case where the amount of energy of light hv is in the range of 1 to 50 cm². In order to separate the semiconductor member 45 from the supporting substrate 10, in addition to irradiation with light hv, a slight stress may be applied to the semiconductor member 45.

Figure 5:
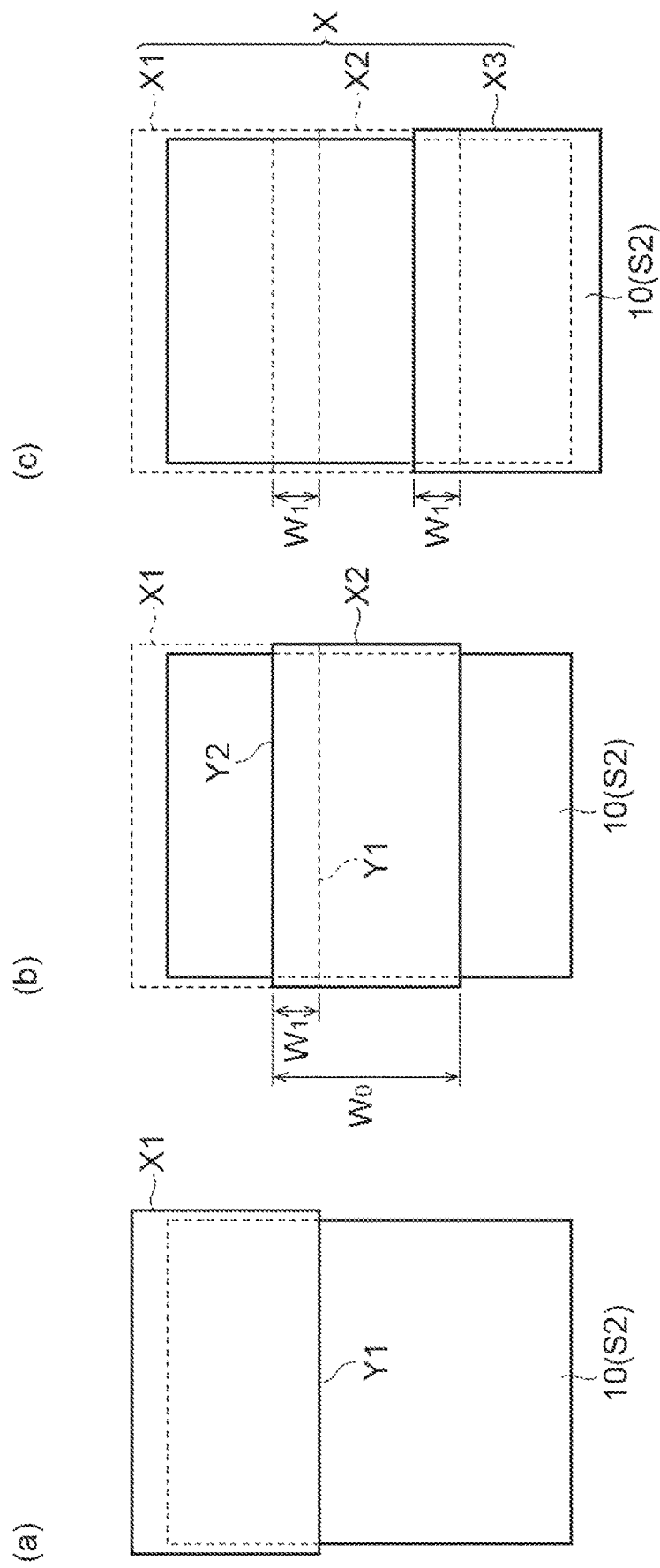
FIG. 5 is a plan view showing an example of a plurality of irradiation target regions.

In the method according to one embodiment, a plurality of irradiation target regions including the rear surface S2 of the supporting substrate 10 are sequentially irradiated with the light hv. FIG. 5 is a plan view showing an example of the plurality of irradiation target regions. In a case of the embodiment of FIG. 5, each of the three irradiation target regions X1, X2, and X3, each of which includes a part of the rear surface S2 and is disposed in series along a certain direction, is irradiated with light hv once. In a case where the light hv is pulsed light, one light irradiation may include one pulsed light or two or more pulsed lights. As viewed from a direction perpendicular to the rear surface, a plurality of irradiation target regions X1, X2, and X3 are disposed such that the adjacent irradiation target regions partially overlap with each other and the region X in which the plurality of irradiation target regions X1, X2, and X3 are combined includes the entire rear surface S2.

In the case of FIG. 5, an end portion including an end Y1 of the irradiated region X1 overlaps with an end portion including an end Y2 of the irradiated region X2. In the adjacent end portions of the irradiation target regions, the parts located directly above the rear surface S2 overlap with each other. Therefore, the part of the rear surface S2 located at the end portion of each irradiated region is irradiated with the light by more than once. As a result, it is considered that, even in a case where the rear surface S2 has a large area, the semiconductor member 45 can be easily peeled off from the supporting substrate 10. Even in a case where the entire irradiated region is irradiated with light having substantially uniform intensity, it may be difficult for the semiconductor member 45 to peel off from the supporting substrate 10. The present inventors presume that this is because the energy of the irradiated light is easily diffused at the end portion of the irradiated region.

A width $W_1$ of the part where the adjacent irradiation target regions overlap may be a range in which the semiconductor member 45 can be appropriately peeled off, and may be, for example, 0.05 cm or more, 0.1 cm or more, or 1000 cm or less. A ratio of the width $W_1$ to a width $W_0$ of the irradiated region may be 0.05 or more, 0.1 or more, or 0.9 or less. Here, the widths $W_0$ and $W_1$ mean the maximum widths of the irradiated region and the overlapping part in the direction perpendicular to the outer circumference of the irradiated region, respectively.

The shape of the irradiated region is not particularly limited, but may be, for example, a rectangle as shown in FIG. 5. For example, in a case where a light source having a light emission surface (for example, a lamp) is used, a region in which the light emission surface is vertically projected onto a plane including the rear surface S2 can be regarded as an irradiated region. The light source may be a lamp having a light emission surface that supplies light of substantially uniform intensity (energy amount) to the entire irradiated region. Therefore, for example, the amount of light energy [J/cm$^2$] on the entire light emission surface of the lamp may be in the range of ±5.0% of the overall average value.

The area of the rear surface S2 of the supporting substrate 10 may be 100 mm$^2$ or more, 400 mm$^2$ or more, or 1000000 mm$^2$ or less. Even in a case where the area of the rear surface S2 of the supporting substrate 10 is large, the semiconductor member can be easily peeled off by the light irradiation method according to the present embodiment. In addition, the supporting substrate 10 is also suppressed from being damaged.

By moving the position of the light source relative to the supporting substrate 10, it is possible to sequentially irradiate a plurality of irradiation target regions with light hv. The supporting substrate 10 may be moved with the light source fixed. Alternatively, the light source may be moved with the supporting substrate 10 fixed. In the case of the embodiment of FIG. 5, the position of the light source with respect to the supporting substrate 10 is irradiated with the light hv during stop of the light source with respect to the supporting substrate 10 while the light source intermittently moves between the positions respectively corresponding to the irradiation target regions X1, X2, and X3. The order of the irradiation target regions to be irradiated with light is arbitrary.

Figure 6:
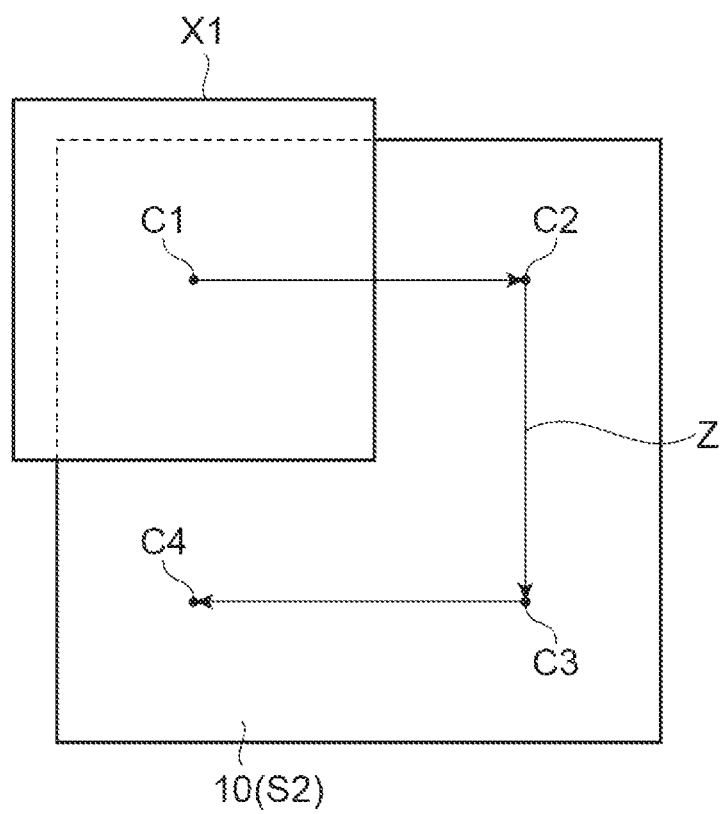
FIG. 6 is a plan view showing an example of a plurality of irradiation target regions.
Figure 7:
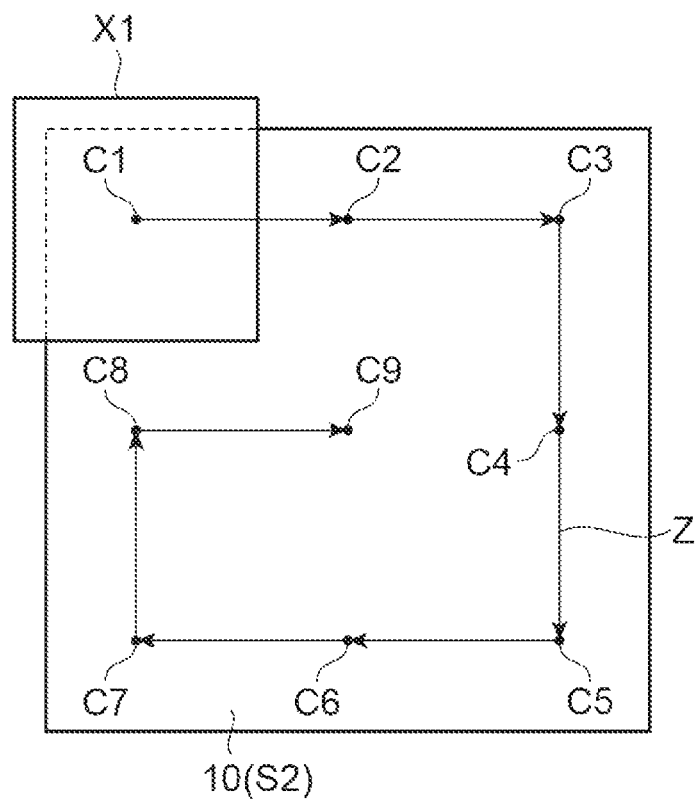
FIG. 7 is a plan view showing an example of a plurality of irradiation target regions.
Figure 8:
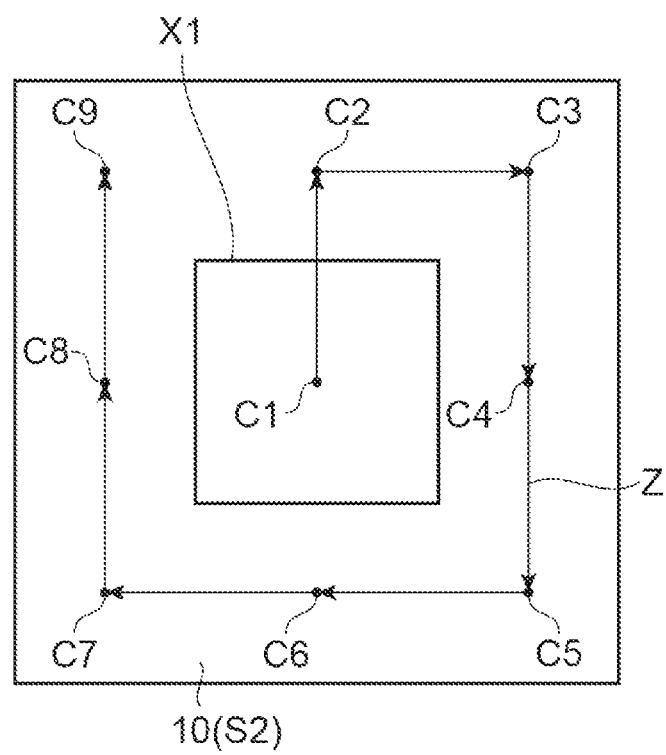
FIG. 8 is a plan view showing an example of a plurality of irradiation target regions.

The configuration such as the number, size, and position of the plurality of irradiation target regions is not limited to the configuration shown in FIG. 5. The region, in which the plurality of irradiation target regions are combined, may include the entire rear surface S2. The end portion including the rear surface S2 of each irradiated region may be irradiated with light more than once. FIGS. 6, 7 and 8 are plan views showing other examples of the plurality of irradiation target regions, respectively. In FIG. 6, instead of showing the irradiation target regions other than the irradiated region X1 irradiated with the first light, the centers C1, C2, C3 and C4 of each irradiated region are shown. The arrow Z indicates the moving direction of the position (that is, the irradiated region) of the light source with respect to the supporting substrate 10. A similar illustration technique is also applied to FIGS. 7 and 8. In the case of the example of FIG. 6, the four irradiation target regions including the rear surface S2 of the supporting substrate 10 are sequentially irradiated with light four times in a clockwise direction. In the case of the example of FIG. 7, the nine irradiation target regions including the rear surface S2 of the supporting substrate 10 are sequentially irradiated with light nine times in a clockwise direction. The last irradiated region includes the center of the rear surface S2. In the case of the example of FIG. 8, starting from the first irradiated region X1 including the center of the rear surface S2, the nine irradiation target regions including the rear surface S2 of the supporting substrate 10 are sequentially irradiated with light nine times in a clockwise direction.

Figure 9:
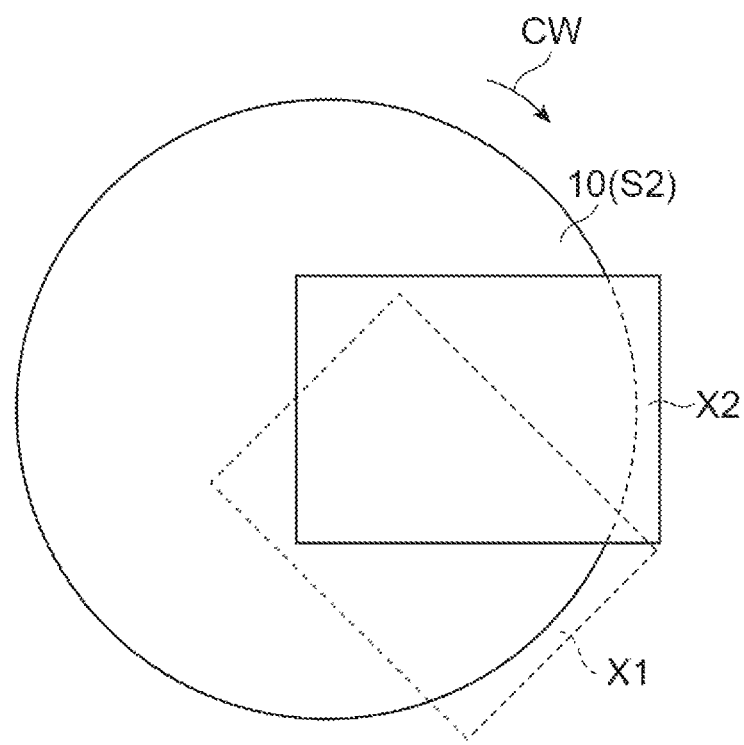
FIG. 9 is a plan view showing an example of a plurality of irradiation target regions.
Figure 9:
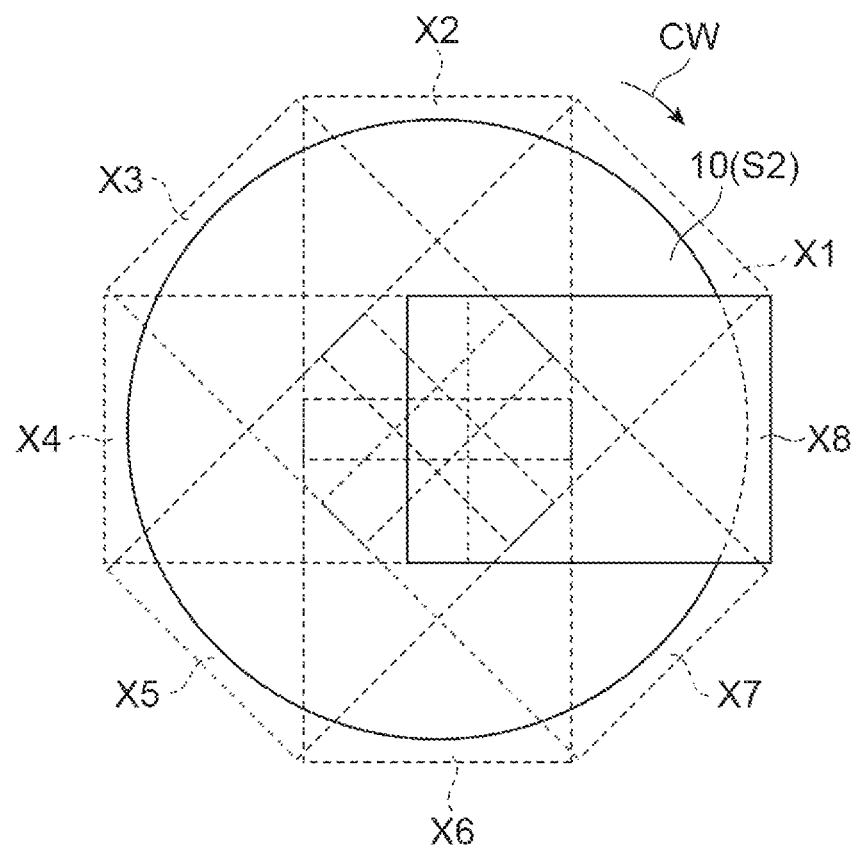

As in the example of FIG. 9, by rotating the supporting substrate with the light source fixed, the plurality of irradiation target regions may be sequentially irradiated with the light hv. In the case of the embodiment of FIG. 9, the light hv is illuminated by the light source fixed to the upper part of the circular rear surface S2 of the supporting substrate 10. After irradiating the first irradiated region X1 with light hv, the supporting substrate 10 is rotated by 45° each time in the clockwise rotation direction CW and the light hv is illuminated once in the order of the irradiation target regions X2, X3, X4, X5, X6, X7 and X8. Each of the eight irradiation target regions X1 to X8 includes a part of the rear surface S2. The rotation angle of the supporting substrate 10 at one time is not limited to 45°, and may be changed to an arbitrary angle such that the region in which the plurality of irradiation target regions are combined includes the entire rear surface S2. The direction of rotation may be a counterclockwise direction. The method of rotating the supporting substrate 10 is advantageous in that the moving distance of the supporting substrate 10 or the light source is small as compared with the method of linearly moving the supporting substrate 10 or the light source, for example. This method can be particularly easily applied in a case where the rear surface S2 of the supporting substrate 10 is circular.

The light hv may be incoherent light or coherent light such as laser light. The incoherent light is light that is not coherent, and is an electromagnetic wave having properties such as no interference fringes, low coherence, and low directivity. The incoherent light tends to be attenuated as the optical path length becomes longer. The laser light is generally coherent light, whereas light such as sunlight and fluorescent light is incoherent light. The incoherent light can also be said to be light excluding laser light. In the method of the present embodiment, the machined semiconductor member can be easily separated from the supporting substrate even with incoherent light having a relatively small amount of energy. By using incoherent light having a small amount of energy, it is possible to suppress damage to a fine structure such as the rewiring layer of the semiconductor member. Since the irradiation area of incoherent light is generally overwhelmingly larger than that of coherent light (that is, laser light), it is possible to reduce the number of irradiations.

The light hv may include infrared rays. The light hv may be pulsed light. In a case where the light hv is incoherent light, the light source is not particularly limited, but may be a xenon lamp. A xenon lamp is a lamp that utilizes light emission by application/discharge in an arc tube filled with xenon gas. The xenon lamp discharges while repeating ionization and excitation. Therefore, the xenon lamp has a stable continuous wavelength from the ultraviolet light region to the infrared light region. The xenon lamp requires a shorter start time than a lamp such as a metal halide lamp. Therefore, the time necessary for the process can be significantly shortened. Since it is necessary to apply a high voltage for light emission, high heat is generated instantaneously. However, the xenon lamp is also advantageous in that the cooling time is short and continuous work is possible.

The irradiation conditions of the xenon lamp include the applied voltage, pulse width, irradiation time, irradiation distance (distance between the light source and the temporary fixing material layer), irradiation energy, and the like. The conditions can be arbitrarily set according to the number of irradiations, and the like.

A part of the curable resin layer 31c may be attached as a residue 31c' onto the separated semiconductor member 45. The attached residue 31c' is removed as shown in FIG. 4(c). The residue 31c' is removed, for example, by washing with a solvent. The solvent is not particularly limited. Examples thereof include ethanol, methanol, toluene, xylene, acetone, methyl ethyl ketone, methyl isobutyl ketone, and hexane. Only one type thereof or a combination of two or more types thereof may be used. In order to remove the residue 31c', the semiconductor member 45 may be immersed in a solvent or ultrasonically cleaned. The semiconductor member 45 may be heated at a low temperature of about 100° C. or less.

By the method exemplified above, the semiconductor element 60 including the machined semiconductor member 45 can be obtained. The semiconductor device can be produced by connecting the obtained semiconductor element 60 to another semiconductor element or a substrate for mounting the semiconductor element.

EXAMPLES

Hereinafter, the present invention will be described in more detail, with reference to examples. However, the present invention is not limited to the examples.
1. Preparation of Temporary Fixing Laminate
1-1. Curable Resin Layer A hydrogenated styrene-butadiene elastomer (trade name: Dynalon 2324P, JSR Corporation) was dissolved in toluene to prepare an elastomer solution having a concentration of 40% by mass. Elastomer solution containing hydrogenated styrene-butadiene elastomer of 80 parts by mass, 1,9-nonanediol diacryllate (trade name: FA-129AS, Hitachi Kasei Co., Ltd.) of 20 parts by mass, and 1 part by mass of peroxyester (trade name: Perhexa 25O, Nichiyu Co., Ltd.) were mixed to obtain a resin varnish.

The obtained resin varnish was coated on a releasing surface of a polyethylene terephthalate (PET) film (Purex A31, Teijin DuPont Film Co., Ltd., thickness: 38 μm) with a precision coating machine. The coated film was dried by heating at 80° C. for 10 minutes to form a curable resin layer having a thickness of about 100 μm.
1-2. Light Absorption Layer As a supporting substrate, a rectangular slide glass having a size of 110×110 mm was prepared. On the prepared slide glass, a titanium layer and a copper layer were formed in this order by sputtering to form a light absorption layer formed of two layers of the titanium layer (thickness: 20 nm) and the copper layer (thickness: 200 nm). In sputtering, after pre-processing by reverse sputtering, the titanium layer and the copper layer were formed through the RF sputtering.
1-3. Temporary Fixing Laminate A curable resin layer cut out to a size of 100×100 mm was disposed on the light absorption layer formed on the slide glass. The curable resin layer was brought into close contact with the light absorption layer by vacuum lamination to obtain a temporary fixing laminate having a laminated structure of the supporting substrate/the light absorption layer/the curable resin layer.
2. Peeling Test Example A semiconductor chip (size: 100 mm×100 mm) was disposed on the curable resin layer of the temporary fixing laminate. The curable resin layer was cured by heating at 180° C. for 1 hour to obtain a test piece for a peeling test having the semiconductor chip temporarily fixed to the supporting substrate.

From the supporting substrate side of the temporary fixing laminate, each of the three irradiation target regions including the rear surface of the supporting substrate was irradiated with pulsed light by means of a xenon lamp. The end portions of the adjacent irradiation target regions overlap with each other, and the width $W_1$ of the overlapping part was 0.75 cm. PulseForge (registered trademark) 1300 manufactured by NovaCentrix was used as the xenon lamp. The xenon lamp has a light emission surface with a size of 150 mm×75 mm, which emits substantially uniform light. The wavelength range of the emitted light is 200 nm to 1500 nm. Each of the irradiation target regions was irradiated with one pulsed light having an applied voltage of 800 V and a pulse width of 250 μs. The amount of energy of each irradiated pulsed light was 3.4 km'.

Irradiating the three irradiation target regions with light resulted in peeling of the semiconductor chip without breaking the slide glass.

Comparative Example

From the slide glass side of the temporary fixing laminate similarly to the Example, two irradiation target regions that were in contact with each other without overlapping the end portions at the center of the rear surface of the slide glass, were irradiated with the pulsed light by means of the xenon lamp under the same conditions as in the Example. After irradiation, it was confirmed that the semiconductor chip was not peeled off at the center of the slide glass.

REFERENCE SIGNS LIST

1: temporary fixing laminate, 10: supporting substrate, 30: temporary fixing material layer, 31, 31A, 31c: curable resin layer, 31B, 32: light absorption layer, 40: semiconductor substrate, 41: rewiring layer, 45: semiconductor member, 50: sealing layer, 60: semiconductor element, hv: light, S3: outermost surface, S1: supporting surface, S2: rear surface, X: region in which irradiation target regions are combined, X1, X2, X3: irradiated region.

The invention claimed is:
1. A method of producing a semiconductor device, the method comprising:

providing a temporary fixing laminate comprising a supporting substrate and a temporary fixing material layer, the supporting substrate comprising a supporting surface and a rear surface opposite to the supporting surface, the temporary fixing material layer being provided on the supporting surface and comprising a curable resin layer comprising at least one outermost surface of the temporary fixing material layer;

temporarily fixing a semiconductor member to the supporting substrate with the temporary fixing material layer interposed therebetween;

machining the semiconductor member temporarily fixed to the supporting substrate; and separating the machined semiconductor member from the supporting substrate by irradiating the temporary fixing laminate with light from a side of the rear surface, wherein at least a part of the temporary fixing material layer is a light absorption layer that generates heat by absorbing the light, a plurality of irradiation target regions set at the rear surface are sequentially irradiated by the light, each of the irradiation target regions includes a part of the rear surface, the light is incoherent light including an infrared ray, the irradiation target regions adjacent to each other partially overlap with each other as viewed from a direction perpendicular to the rear surface so that the separation of the machined semiconductor member from the supporting substrate is facilitated, and a region in which the plurality of the irradiation target regions are combined includes the entire rear surface.

2. The method according to claim 1, wherein a light source of the incoherent light is a xenon lamp.

3. The method according to claim 1, wherein the temporary fixing material layer comprises, as the light absorption layer, a metal layer that is a separate layer from the curable resin layer.

4. The method according to claim 1, wherein the plurality of the irradiation target regions set at the rear surface are sequentially irradiated with the light by rotating the supporting substrate in a state where a light source of the light is fixed.

* * * * *